(12) United States Patent
Mazal et al.

(10) Patent No.: US 11,834,873 B2
(45) Date of Patent: *Dec. 5, 2023

(54) SIDE-DOOR LOCK FOR A MOTOR VEHICLE

(71) Applicant: Kiekert AG, Heiligenhaus (DE)

(72) Inventors: Radek Mazal, Chleny (CZ); Jan Zejda, Chrudim (CZ)

(73) Assignee: Kiekert AG, Heiligenhaus (DE)

( * ) Notice: Subject to any disclaimer, the term of this patent is extended or adjusted under 35 U.S.C. 154(b) by 504 days.

This patent is subject to a terminal disclaimer.

(21) Appl. No.: 17/174,154

(22) Filed: Feb. 11, 2021

(65) Prior Publication Data

US 2021/0164273 A1 Jun. 3, 2021

Related U.S. Application Data

(63) Continuation of application No. 15/111,923, filed as application No. PCT/DE2015/100022 on Jan. 15, 2015, now Pat. No. 10,947,759.

(30) Foreign Application Priority Data

Jan. 15, 2014 (DE) ...................... 10 2014 000 294.2

(51) Int. Cl.
*E05B 85/02* (2014.01)
*E05B 81/54* (2014.01)
(Continued)

(52) U.S. Cl.
CPC .............. *E05B 15/02* (2013.01); *E05B 81/54* (2013.01); *H05K 5/0217* (2013.01); *H05K 5/0247* (2013.01); *H05K 7/026* (2013.01)

(58) Field of Classification Search
CPC .......... E05B 79/00; E05B 79/02; E05B 81/25; E05B 81/54; E05B 85/02; H05K 5/0217;
(Continued)

(56) References Cited

U.S. PATENT DOCUMENTS 5,360,351 A 11/1994 Periou
6,109,674 A 8/2000 Bartel
(Continued)

FOREIGN PATENT DOCUMENTS

DE 10100010 A1 7/2002
DE 19702205 B4 12/2004
(Continued)

OTHER PUBLICATIONS

International Search Report and Written Opinion dated Jun. 11, 2015 for related International Patent Application No. PCT/DE2015/100022.

*Primary Examiner* — Christine M Mills
*Assistant Examiner* — Yahya Sidky
(74) *Attorney, Agent, or Firm* — Renner, Otto, Boisselle & Sklar, LLP

(57) ABSTRACT

A motor vehicle lock includes at least one electric component carrier, and said electric component carrier is a modular element that includes at least one conductor, a switch and/or an additional component. The electric component carrier includes a separate housing and can be fastened to an outer surface of the motor vehicle lock.

20 Claims, 4 Drawing Sheets

(51) Int. Cl.
  *H05K 5/02* (2006.01)
  *H05K 7/02* (2006.01)
  *E05B 15/02* (2006.01)

(58) Field of Classification Search
  CPC .. H05K 5/0247; H05K 5/0221; H05K 5/0239; H05K 7/026; Y10T 292/62; Y10T 292/03; Y10T 292/1047; Y10T 292/1082; Y10S 292/23; Y10S 292/54; Y10S 292/53; Y10S 292/64
  See application file for complete search history.

(56) References Cited

U.S. PATENT DOCUMENTS

| | | | |
|---|---|---|---|
| 6,264,253 B1 * | 7/2001 | Takaishi | E05B 85/26 292/201 |
| 7,500,700 B2 | 3/2009 | Kunst | |
| 2002/0175061 A1 | 11/2002 | Shinkawa | |
| 2011/0242786 A1 * | 10/2011 | Ziganki | E05B 17/0004 361/809 |
| 2012/0096905 A1 | 4/2012 | Yamagata | |
| 2014/0001778 A1 | 1/2014 | Yokomori | |

FOREIGN PATENT DOCUMENTS

| | | |
|---|---|---|
| DE | 202006009247 U1 | 8/2006 |
| DE | 202006011116 U1 | 9/2006 |
| DE | 102006017830 A1 | 10/2007 |
| DE | 202008015696 U1 | 4/2010 |
| DE | 202010004424 U1 | 7/2010 |
| DE | 102009053384 A1 | 5/2011 |
| DE | 102006037159 B4 | 3/2012 |
| DE | 102012211756 A1 | 1/2014 |
| DE | 102012211759 A1 | 1/2014 |
| EP | 1087082 A2 | 3/2001 |
| EP | 1284333 A2 | 2/2003 |
| JP | H0826710 B2 | 3/1996 |
| WO | 2005012676 A1 | 2/2005 |

* cited by examiner

SIDE-DOOR LOCK FOR A MOTOR VEHICLE

FIELD OF INVENTION

The invention relates to a motor vehicle latch, comprising at least one electric component carrier, said electric component carrier being a modular element and comprising at least one conductor, a switch and/or additional component.

BACKGROUND OF INVENTION

In order to provide power to electric components such as an electric motor and/or a micro switch, electric conductors are known to be integrated in a latch housing of a side door latch for a motor vehicle. A plastic housing part containing electric conductors is referred to as electric component carrier (ECC). In most cases, electric contacts extend from the electric component carrier so that the electric components are adaptable.

The known solutions described below, relate for instance to used electric component carriers and/or carrier plates, installed in motor vehicle latches.

The state of the art includes a carrier plate, disclosed in document DE 20 2006 011 116 U1. The document discloses a carrier plate, containing several electric components, such as conductors and switches, which together with a carrier plate are inserted in the latch housing in a compact modular design. In this embodiment, the carrier plate and its electric conductors form a single piece, in particular, an injection molded plastic part. The carrier plate is also part of the motor vehicle latch housing.

DE 10 2009 053 384 A1 also discloses a plastic carrier on which electric components are mounted. This plastic carrier also forms part of the latch housing. More precisely, this plastic carrier is a housing half or a top housing part of a latch.

DE 10 2006 037 159 B4 also discloses an electric component carrier, forming part of a latch housing.

The generic state of the art according to the above documents reaches its limits as regards providing a cost-effective and adaptive design of a latch housing without the use of electric component carriers that are complex and expensive to produce.

SUMMARY OF INVENTION

The invention is based on the technical problem that the electric component carrier is a very costly component to produce. On one hand, the electric component carrier also contains in most cases a high number of electric components, with some of them being very sensitive and, on the other hand, several production steps are, in most cases, required for mounting and aligning the conductors. In most cases, the electric components must be inserted in the latch housing, injection molded from plastic, in several work steps. In many situations, it is impossible or very complex and expensive to replace defective electric components. Also, for each new developed latch an individually adapted component carrier with electric elements must be produced.

In order to solve this task, the invention suggests a modular electric component carrier for motor vehicle door latches, containing a separate housing and that can be fastened to the outer surface of the motor vehicle latch. This electric component carrier is advantageous in as much as it forms a compact independent unit, containing electric components, such as conductors, switches, contacts and other parts. Consequently, no electric conductors and other electric components are required in the latch housing. Instead, the electric wiring, switching means and elements are installed in the modular electric component carriers. Using the electric contacts on the electric component carrier, an electric motor can, for instance be directly connected. A potential micro switch is installed in this electric component carrier and is placed into the housing of the electric component carrier and in the areas of the elements to be connected in such a way that, for instance, switching of the micro switch is made possible. Also, production costs for the latch are extremely low as no conductors are required in the latch housing.

In a further embodiment, the modular electric component carrier can also contain a plug and/or socket facilitating a direct connection. In addition, the possibility of the formation of a plug and/or of a socket allows a stable positioning of the modular electric component carrier on the latch housing. Such an interposed plug is also advantageous for the adaptation of different electrical systems. This embodiment does, for instance, offer the option of connecting plugs or connections with cable harnesses instead of individual conducting wires.

The housing of the electric component carrier can be a single injection-molded plastic piece and can contain reinforcements so that sensitive electric components, such as conductors, lead frames, LEDs and switches are protected against external influences. From a production point of view, in particular, the conductors of the electric component carriers are combined with the carrier plate and are joint together with the plastic housing in a single injection-molding process. Electric conductors and/or, depending on the model, electric components can then be connected or adapted to this carrier plate, forming the housing of the electric component carrier. In this way, a modular electric component carrier can be produced which in turn is advantageous as regards maintenance and repair work as any working time and repair costs are minimized due to the convenient replacement. It would also be feasible and is another advantage of the invention that the complete electric component carrier is replaceable.

The outer surface of the motor vehicle latch is respectively accessible so that an electric component carrier can be adapted to the outer surface. A surface can thus, in particular, consist of two bases, extending out of the housing of the electric component carrier. Due to the design being respectively adapted to the electric component carrier, the bases provide a support, increasing the stability of the electric component carrier. At the same time, the bases provide guides for, for instance, plug-in contacts. The support is then provided by a positive connection between the electric component carrier and the housing of the motor vehicle latch.

Another advantage of the invention is that the electric component carrier forms a single piece together with a conductor and/or a switching device. The invention can, for instance, provide a carrier plate on which several electric components are attached by, for instance, soldering. The housing can then be filled with plastic in an injection-molding process, so that the electric components are, for instance, protected against humidity and vibrations. As a result, an inseparable unit is created that is defined as a single-piece design according to the invention. Due to the housing and the bonded design, the sensitive electric components are effectively protected against external influences such as impacts and thus obtain, due to their rigid connection, a stability and/or stiffness, extending the life of the electric component carrier.

It can also be advantageous for a switching means to be arranged in the electric component carrier in such a way that the switching means extends out of the housing of the electric component carrier and into the housing of the motor vehicle door latch, allowing the switching means to cooperate with mechanical components. The switching means can, for instance, be a micro switch, in contact with mechanical components in the latch, such as a catch or another lever. Again, this permits a direct determination of a status and/or of a position of a moved component of the motor vehicle latch.

It can also be advantageous for the electric component carrier to interact with at least one fastening means of the housing of the motor vehicle latch. This prevents an undesired release of the electric component carrier from the motor vehicle latch housing. As a result of the one or two or several fastening means, the electric component carrier can be fixed to the motor vehicle latch housing, allowing a reliable transmission of electrical signals by preventing loose contacts. Fastening means refers, for instance, to positive connections in form of retaining lugs, hooks or brackets formed from separate elements or as a single piece with the electric component carrier and/or the housing of the motor vehicle latch. According to the invention, the electric component carrier could also be bolted or riveted to the housing of the motor vehicle latch. Feasible are also adhesives or welding seams that are liquid prior to solidifying or cooling down or drying.

An additional advantage can result from the fastening means having a non-positive and/or positive connection with the electric component carrier. A non-positive connection includes clamps, wedges or screwed connections, connecting the electric component carrier to the latch housing. Bolt connections as well as rivet and pin connections are also positive connections. The physical operating principles can offer individual advantages. Screwed connections are, for instance, easily detachable and can be designed to cope with many types of stressing, such as torsion, tension, shearing and bending. Pin and bolt connections do, on the other hand, prevent unintentional loosening.

Particularly advantageous is for the fastening means to be designed as clip, snap and/or snap-lock connections and/or screwed connections and/or bolt and/or rivet connections. Clip, snap or snap-lock connections are favorable as they can be directly designed as parts or elements of the latch housing. They are thus formed during the production process of the latch housing, such as, for instance, during injection molding. This results in time and cost savings during production.

Optionally, also the housing of the electric component carrier can contain clip, snap or snap-lock connections. As already mentioned, screws offer advantages of withstanding considerable loading and offer, in particular, flexible installation. Bolt and pin connections are connecting means able to withstand maximum stressing. In the disclosed invention, these aids are designed as clamps or snap-lock connections, forming part of the latch housing and extending around the circumference of the electric component housing and retain it. A connection partner is designed in accordance with the shape of the respective connection partner in order to provide the optimum cooperation with its connection partner.

Another advantage is that the housing of the electric component carrier is made of plastic. Due to the use of plastic, material costs are low and the carrier plate with the electric components can be effectively inserted or integrated in the housing as part of an injection-molding process. A plastic housing of the electric component carrier also offers a lower weight than a comparable housing made from a metal material. The plastic housing is also advantageous, as during the forming phase, the plastic can be equipped with fastening means and other useful elements.

The electric component carrier also contains at least one connection, in particular a plug-in connection for connecting electronics and/or controls. A certain number of connections on the electric component carrier offers a plurality of options or interfaces, for connecting other electrical units, such as a control unit. These interfaces are plug-in contacts that are connected to other contacts. As a result, no plug-in contacts are required on the latch housing itself, thus reducing production costs.

Particularly advantageous is the fact that the plug-in contacts of the electric component carrier are, in particular, contact tabs extending from the electric component carrier. The contact tabs can, for instance, be directly connected to an electric component in the motor vehicle latch, such as a motor. The plug-in contacts extend from the electric component carrier into the motor vehicle latch so that the electric components can be directly connected. Due to the extension of the plug-in contacts, the electric component carrier has a considerable range and reliably reaches the components in the motor vehicle latch, such as an electric motor. The contact tabs can extend through bases of the latch housing into the latch housing, with the bases providing stability for the electric component carrier. The bases also protect the contact tabs against external influences, such as damage or corrosion. The motor vehicle latch housing can be designed without conductors, considerably contributing to reducing costs, as the required conductors are already formed in the electric component carrier.

BRIEF DESCRIPTION OF DRAWINGS

Below, the invention is explained in more detail with reference to drawings, in which.

DETAILED DESCRIPTION

Figure 1:
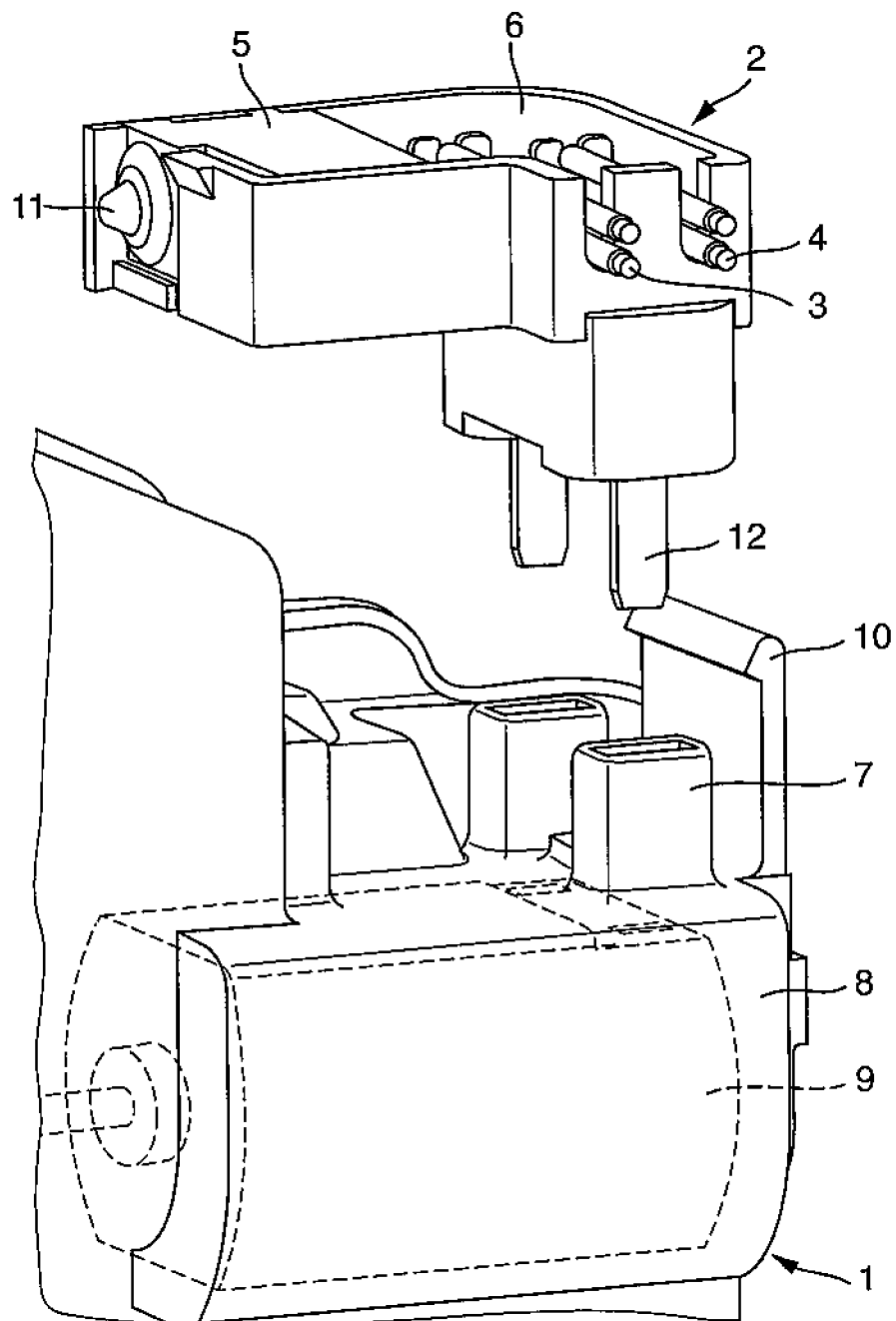
FIG. 1 shows a three-dimensional view of an electric component carrier in a first embodiment, as well as part of a latch housing prior to installation of the electric component carrier.

In all figures, the modular electric component carrier 2 has a respective compact housing 6. The housing 6 is made of plastic and is sufficiently large for electric components to be used. Although all figures show an open aspect of this installation space, it can also be subsequently provided with a cover for protection or can be enclosed by injection molding. These potential covers are not shown in the drawings. The installation space contains a switch 5 with an electric contact 11 and, as an example, several electric conductors 3 and 4. The electric component carrier 2 contains plug-in contacts 12, extending out of an extension of the electric component carrier 2. At the same time, the plug-in contacts 12 point in the direction of the latch housing 8 or of a surface 7 of the latch housing 8 of the motor vehicle.

Figure 3:
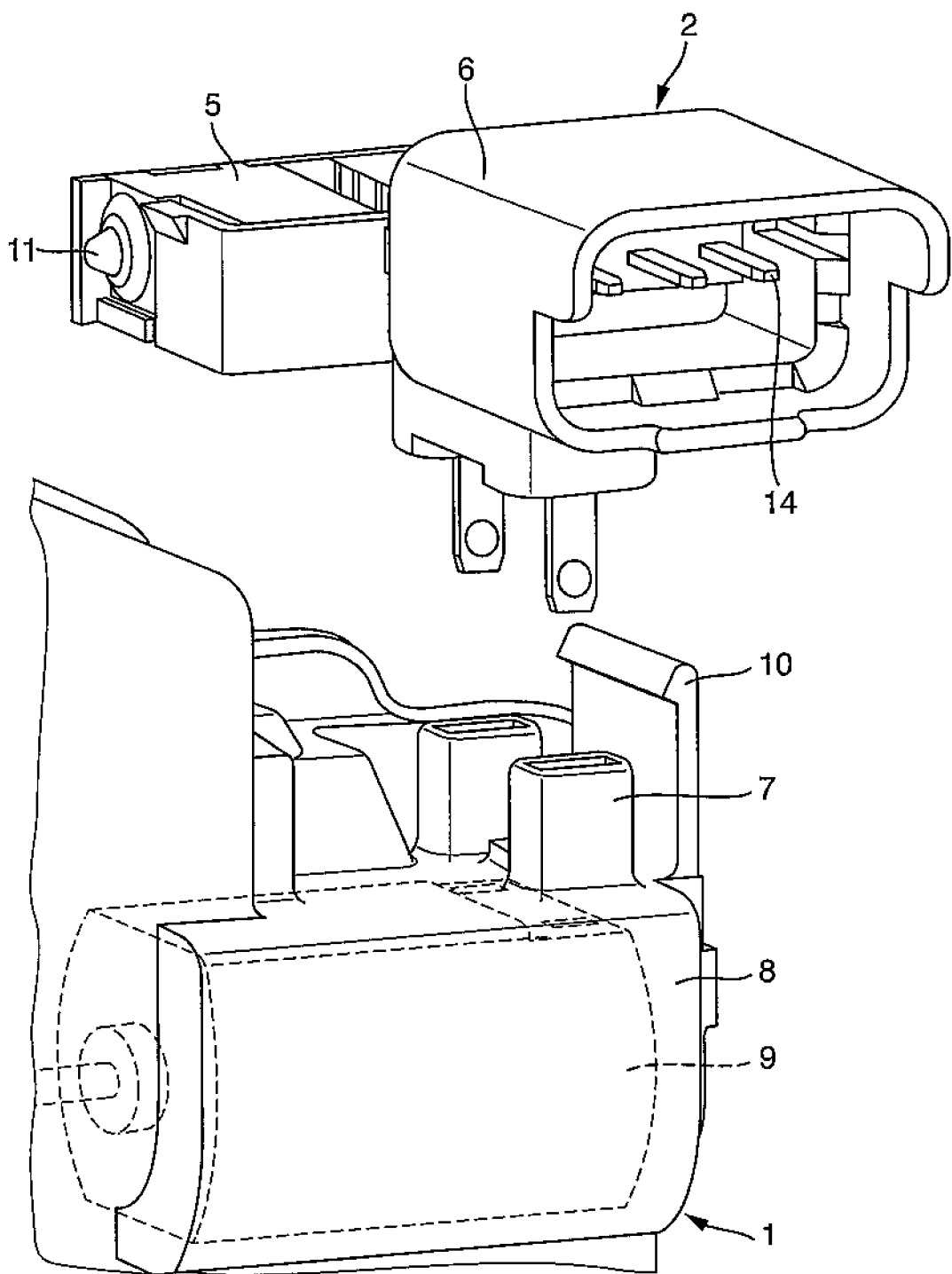
FIG. 3 shows a three-dimensional view of a further embodiment of an electric component carrier and a part of the latch housing prior to the installation of the electric component carrier and FIG. 4 shows a three-dimensional view of the electric component carrier in a second embodiment, as well as part of the latch housing with the electric component carrier installed.
Figure 4:
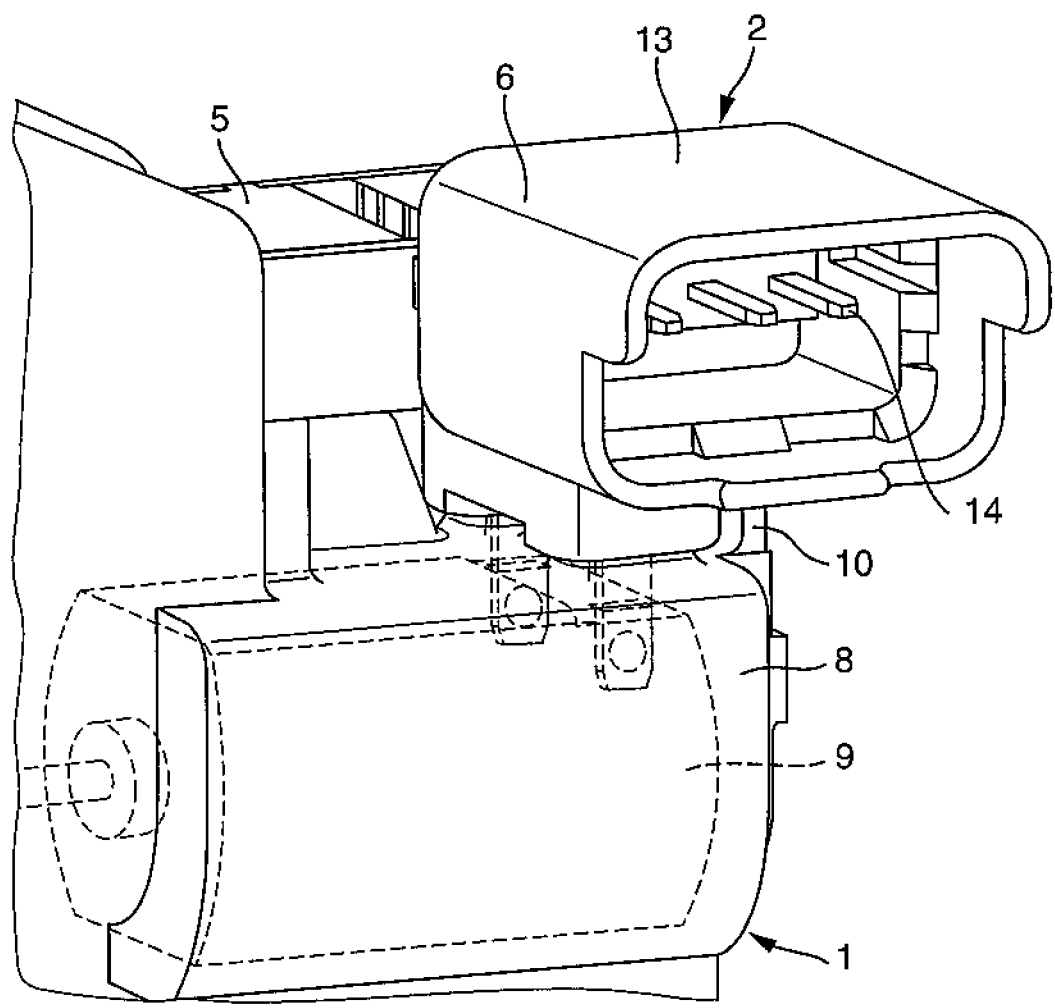

FIGS. 3 and 4 show the electric component carrier 2 in a second embodiment with an additional function as an intermediate means 13. This intermediate means 13 also contains plug-in contacts 14 and all components listed above. The additional plug-in contacts 14 protrude laterally from the electric component carrier housing 6. The positioning of the two embodiment options in relation to the arrangement to the latch housing 8 to the electric component carrier 2 is the same.

Figure 2:
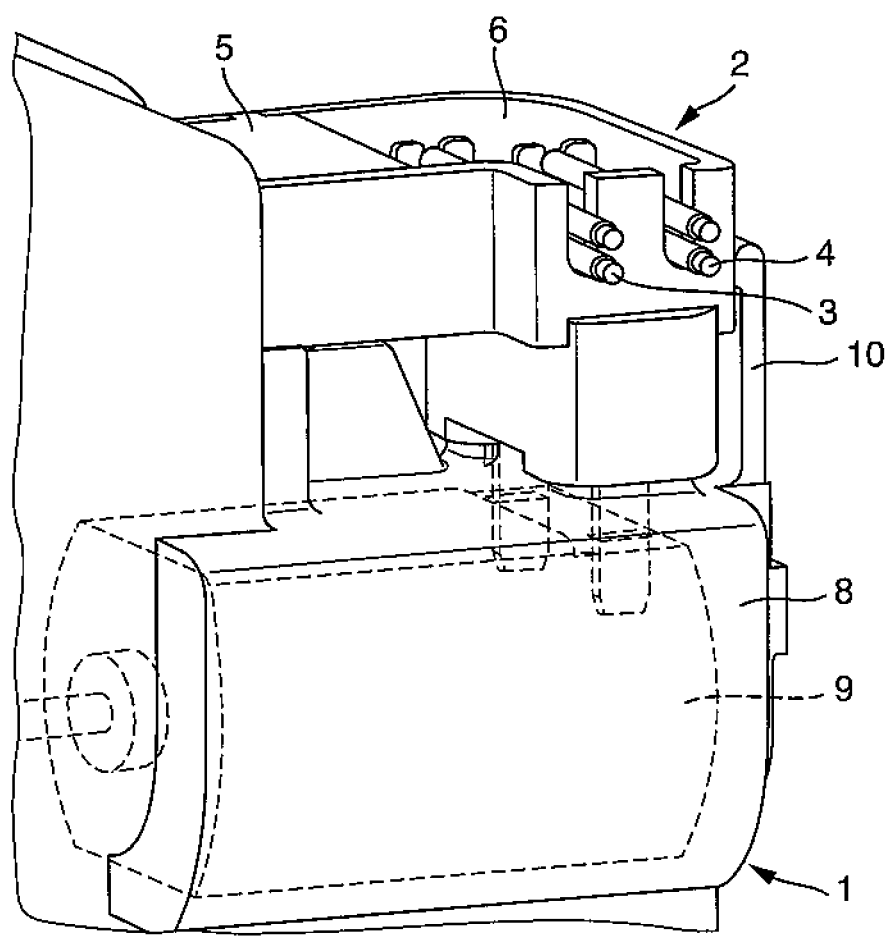
FIG. 2 shows a three-dimensional view of the electric component carrier in a first embodiment, as well as part of a latch housing with the electric component carrier installed.

The latch 1 is arranged below the electric component carrier 2. A part of the latch housing 8 is shown, with the latch housing 8 containing various components. An electromagnetic component is indicated in the latch housing 8. This component is an electric motor 9, containing a motor shaft at its front end and contacts at its rear end. When installed, these contacts are in connection with plug-in contacts 12. FIGS. 2 and 4 show how, in the installed state, the plug-in contacts 12 of the electric component carrier 2 are connected to the electric motor 9 via its contacts.

The latch housing 8 also contains a mounting, with the mounting containing a surface and a fastening means 10. In this embodiment example, the surface of the latch housing 8 consists of two bases 7, with the base 7 facilitating insertion of the plug-in contacts 12 as well as providing the plug-in contacts 12 and the modular electric component carrier 2 with a stable support and protection in the installed state.

In order to prevent the electric component carrier 2 from detaching from the latch 1, the latch housing 8 contains in this embodiment a snap-in connection as fastening means 10. This fastening means 10 retains the electric component carrier 2 in its installed state by means of a non-positive/positive connection with the fastening means 10 extending around the housing 6 of the electric component carrier 2 to retain it.

The invention claimed is:

1. An electric component carrier for a motor vehicle latch, the electric component carrier comprising:
   a housing that is connectable to an accessible outer surface of a separate latch housing;
   at least one electrical conductor;
   at least one switch, wherein the at least one electrical conductor and the at least one switch are arranged in the housing; and
   a plug-in connector that includes at least one plug-in contact tab that protrudes from the electric component carrier and is directly connected to a motor contained in the latch housing.

2. The electric component carrier according to claim 1, wherein the housing of the electric component carrier is formed as a single part.

3. The electric component carrier according to claim 1, wherein the housing of the electric component carrier is filled with injection-molded plastic.

4. The electric component carrier according to claim 1 further comprising at least one electric contact arranged in the housing of the electric component carrier.

5. The electric component carrier according to claim 4, wherein the at least one plug-in contact tab protrudes from a different surface of the housing of the electric component carrier as compared with a surface of the housing of the electric component carrier from which the at least one electric contact protrudes.

6. The electric component carrier according to claim 4, wherein the at least one plug-in contact tab protrudes from the electric component carrier in a direction that is perpendicular to a direction in which the at least one electric contact protrudes from the electric component carrier.

7. The electric component carrier according to claim 4, wherein the at least one electrical conductor, the at least one switch, and the at least one electric contact are formed inseparably in the electric component carrier.

8. The electric component carrier according to claim 1, wherein the at least one switch is covered by plastic.

9. The electric component carrier according to claim 1, wherein the plug-in connector includes at least one additional plug-in contact in addition to the plug-in contact having the at least one plug-in contact tab directly connected to the motor.

10. The electric component carrier according to claim 1, wherein the housing of the electric component carrier has a base that defines a guide for the at least one plug-in contact tab.

11. The electric component carrier according to claim 1, wherein the at least one plug-in contact tab includes two or more plug-in contact tabs.

12. The electric component carrier according to claim 1, wherein the housing of the electric component carrier includes a clip, snap, or snap-lock connection for connection with the latch housing.

13. A motor vehicle latch assembly comprising:
    a latch housing that contains a motor vehicle latch and has an outer surface that is accessible from outside the latch housing;
    at least one electric component carrier including a housing separable from the latch housing, at least one electrical conductor and at least one switch arranged in the housing separately from the latch housing, and a plug in connection that is connectable to the outer surface from outside of the latch housing, wherein the plug in connection includes at least one plug-in contact tab that protrudes from the electric component carrier; and
    a motor, wherein the at least one plug-in contact tab is directly connected to the motor contained in the latch housing.

14. The motor vehicle latch assembly according to claim 13, wherein the latch housing is formed without a plug-in contact.

15. The motor vehicle latch assembly according to claim 13 further comprising at least one electric contact arranged in the housing of the electric component carrier.

16. The motor vehicle latch assembly according to claim 15, wherein the housing of the electric component carrier is filled with injection-molded plastic, and wherein the at least one electrical conductor, the at least one switch, and the at least one electric contact are formed inseparably in the electric component carrier.

17. The motor vehicle latch assembly according to claim 13, wherein the at least one switch extends into the latch housing containing the motor vehicle latch and cooperates with mechanical components of the motor vehicle latch.

18. The motor vehicle latch assembly according to claim 13, wherein the latch housing has a fastener that engages the housing of the at least one electric component carrier.

19. The motor vehicle latch assembly according to claim 18, wherein the fastener and the housing of the at least one electric component carrier have a non-positive or a positive connection.

20. The motor vehicle latch assembly according to claim 19, wherein the fastener includes at least one of a clip, a snap, a snap-lock connection, a screwed connection, a bolt connection or a rivet connection.

* * * * *